United States Patent
Zhang et al.

(10) Patent No.: US 6,946,238 B2
(45) Date of Patent: Sep. 20, 2005

(54) PROCESS FOR FABRICATION OF OPTICAL WAVEGUIDES

(75) Inventors: Jun-Ying Zhang, St. Paul, MN (US);
Brian J. Gates, Eagan, MN (US);
Jeremy K. Larsen, Oakdale, MN (US);
Barry J. Koch, Woodbury, MN (US);
Terry L. Smith, Roseville, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 194 days.

(21) Appl. No.: 10/328,766

(22) Filed: Dec. 24, 2002

(65) Prior Publication Data

US 2003/0176002 A1 Sep. 18, 2003

(51) Int. Cl.[7] ................................................. G03C 5/00
(52) U.S. Cl. ........................ 430/321; 313/314; 313/322
(58) Field of Search ................................ 430/321, 322, 430/313, 311, 314; 438/31, 22; 385/124, 128, 129, 142

(56) References Cited

U.S. PATENT DOCUMENTS

| | | | |
|---|---|---|---|
| 3,849,136 A | 11/1974 | Grebe | |
| 3,873,361 A | 3/1975 | Franco et al. | |
| 5,144,634 A | 9/1992 | Gasser et al. | |
| 5,281,305 A | 1/1994 | Lee et al. | |
| 5,389,396 A | 2/1995 | Razeghi | |
| 5,613,995 A | 3/1997 | Bhandarkar et al. | |
| 5,858,824 A * | 1/1999 | Saitoh | 438/167 |
| 5,879,962 A | 3/1999 | DePuydt et al. | |
| 6,130,972 A | 10/2000 | Shiraishi et al. | |
| 6,312,581 B1 | 11/2001 | Bruce et al. | |
| 6,678,453 B2 * | 1/2004 | Bellman et al. | 385/129 |

FOREIGN PATENT DOCUMENTS

| | | | |
|---|---|---|---|
| EP | 0 477 898 A2 | 4/1992 | |
| JP | 63296040 | 12/1988 | |
| JP | 10-239541 * | 9/1998 | G02B/6/12 |
| WO | WO 99/54714 | 10/1999 | |
| WO | WO 02/42808 A2 | 5/2002 | |

OTHER PUBLICATIONS

S.M. Rossnagel, et al; "Collimated Magnetron Sputter Deposition", *Journal of Vacuum Science Technology A.* (Mar./Apr. 1991); vol. 9, No. 2; pp. 261–265.

(Continued)

Primary Examiner—Thorl Chea
(74) Attorney, Agent, or Firm—Gregg H. Rosenblatt (57) ABSTRACT

A method for manufacturing an optical waveguide device in accordance with the present invention includes the steps of depositing a lower cladding layer; coating a photoresist layer directly on the lower cladding layer; patterning the photoresist layer to create channels; depositing a core layer, wherein a first portion of the core layer is deposited inside the channels and a second portion overlays the patterned photoresist layer; removing the patterned photoresist layer and the second portions of the core layer overlaying the patterned photoresist layer; and depositing an upper cladding layer.

24 Claims, 10 Drawing Sheets

OTHER PUBLICATIONS

C.C. Ll, et al; "Er–Doped Glass Ridge–Waveguide Amplifiers Fabricated with a Collimated Sputter Deposition Technique", *IEEE Photonics Technology Letters* (Sep. 1997); vol. 9, No. 9; pp. 1223–1225.

S. Namiki & Y. Emori; "Ultrabroad–Band Raman Amplifiers Pumped and Gain–Equalized by Wavelength–Division–Multiplexed High–Power Laser Diodes", *IEEE Journal on Selected Topics in Quantum Electronics* (Jan./Feb. 2001); vol. 7, No. 1; pp. 3–16.

D.J.L. Birkin, et al; "3.6 mW Blue Light by Direct Frequency Doubling of a Diode Laser Using an Aperiodically Poled Lithium Niobate Crystal", *Applied Physics Letters* (May 21, 2001); vol. 78, No. 21; pp. 3172–3174.

M. Kawachi; "Silica Waveguides on Silicon and Their Application to Integrated–Optic Components", *Optical and Quantum Electronics* (Sep. 1990); vol. 22, No. 5; pp. 391–416.

J.M.P. Delavaux & J.A. Nagel; "Multi–Stage Erbium–Doped Fiber Amplifier Designs", *Journal of Lightwave Technology* (May 1995); vol. 13, No. 5; pp. 703–720.

R. Germann, et al; "Silicon Oxynitride Layers for Optical Waveguide Applications", *Journal of the Electrochemical Society* (2000); vol. 147, No. 6; pp. 2237–2241.

B.S. Bhumbra, et al; "High Power Operation of GaInAsP/GaInAs MQW Ridge Lasers Emitting at 1.48 $\mu$m", *Electronics Letters* (Oct. 11, 1990); vol. 26, No. 21; pp. 1755–1756.

Book: T.Tamir (Ed.); *Guided–Wave Optoelectronics*, 2nd Edition; Springer–Verlag, Heidelberg, Germany (1990); ISBN 3–540–52780–X.

* cited by examiner

PROCESS FOR FABRICATION OF OPTICAL WAVEGUIDES

BACKGROUND OF THE INVENTION

This invention relates to integrated optical circuit fabrication, and more particularly to a novel process for fabrication of optical waveguides, whereby lift-off, rather than etching, is used to pattern the waveguide core.

Products based on so-called planar lightwave circuits (PLCs) have the possibility of significantly reducing the cost and size of optical components, while at the same time enhancing functionality. Notable in this area is the work on doped $SiO_2$ glass (See, e.g., M. Kawachi, *Optical and Quantum Electronics* 22 (1990) 391–416). These low-doped glassy waveguide structures are similar to well-known silica optical fibers with respect to optical guiding and hence have similar modal fields resulting in low coupling losses between the chip and standard single mode fiber.

However, an inherent disadvantage of these low-index-contrast glassy structures is a rather large minimum radius of curvature allowable in circuits, typically greater than 15 mm. Devices containing many bends become very large, such that only a small number of them may be arranged on a wafer, which is less cost-effective. In order to fabricate optical components in a more cost-effective way in mass production, it is desirable to increase the device density.

Figure 1A:
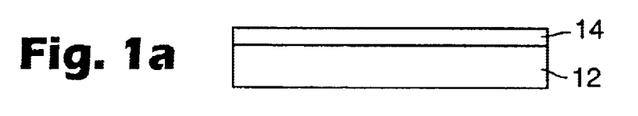
FIG. 1a to FIG. 1h is a schematic step-wise illustration of a conventional method for manufacturing channel optical waveguides.
Figure 1B:
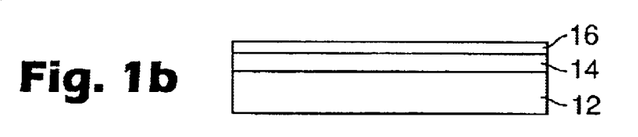
Figure 1C:
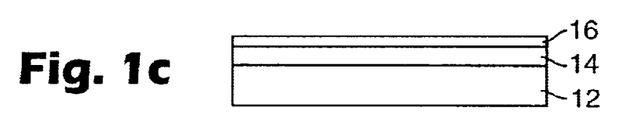
Figure 1D:
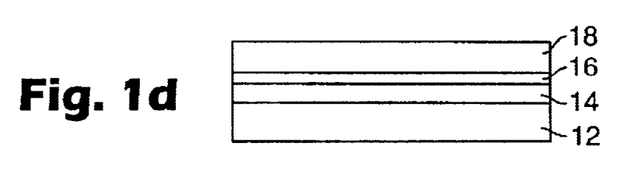
Figure 1E:
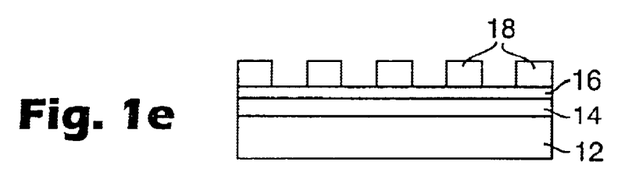
Figure 1F:
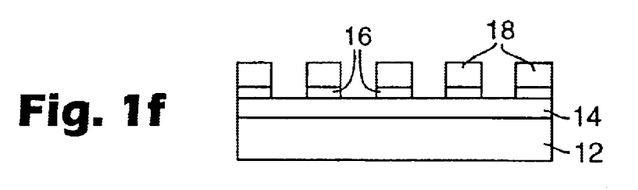

FIG. 1a to FIG. 1h illustrates schematically the steps in an exemplary conventional process for manufacturing channel waveguides 10. As illustrated in FIG. 1a, a silicon substrate 12 is first provided and a lower cladding layer 14 is deposited on its upper surface. Referring to FIG. 1b, a core layer 16 is deposited on top of the cladding layer. The cladding layer 14 and core layer 16 may be deposited by various methods, such as flame hydrolysis deposition (FHD), chemical vapor deposition (CVD), plasma-enhanced CVD (PECVD), sol-gel, etc. An example for high index contrast material for fabrication of planar waveguides may be found in PCT publication WO 99/54714, where SiON and $SiO_2$ are used as a core and cladding layers, respectively.

An alternative embodiment includes a lower optical cladding comprising a substrate of a transparent material having an appropriate index, such as a Ge doped SiO2 core on an undoped fused quartz substrate.

Figure 1G:
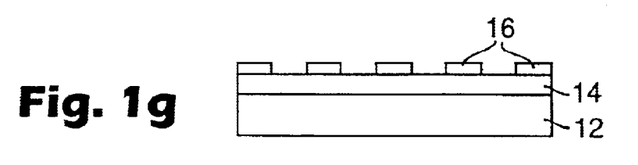
Figure 1H:
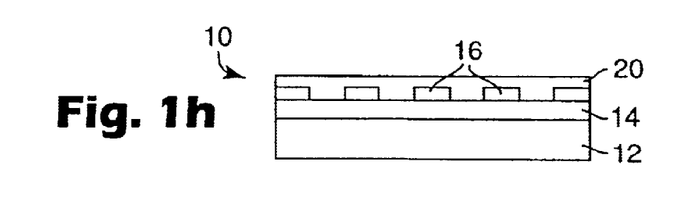

In the next step (FIG. 1c), the core layer 16 is annealed. Following core layer annealing (FIG. 1d), a photoresist or metal mask 18 is coated over the core layer 16. Photolithography (FIG. 1e) and reactive ion etching (RIE) (FIG. 1f) are used to define the desired ridge structure. The photoresist or metal mask 18 is stripped as illustrated in FIG. 1g. Finally, FIG. 1h illustrates deposition of an upper cladding layer 20.

As seen in FIG. 1a to FIG. 1h conventional etching processes require a large number of steps. RIE in particular is a time-consuming step in processing. RIE also may produce wall roughness that may lead to scattering loss in the resulting channel waveguide. Additionally, conventional methods require significant capital investment to provide necessary equipment and processes.

Given the difficulties with traditional etching, other methods used in integrated circuit manufacturing have been attempted. However, there have been difficulties, such as tearing or damage, applying these methods to the fabrication of optical waveguides.

The desire remains for a more efficient and cost-effective method for fabrication of optical waveguides.

SUMMARY OF THE INVENTION

A method for manufacturing an optical waveguide device in accordance with the present invention includes the steps of depositing a lower cladding layer; coating a photoresist layer directly on the lower cladding layer; patterning the photoresist layer to create channels; depositing a core layer, wherein a first portion of the core layer is deposited inside the channels and a second portion overlays the patterned photoresist layer; removing the patterned photoresist layer and the second portions of the core layer overlaying the patterned photoresist layer; and depositing an upper cladding layer.

The optical waveguide may be a single-mode waveguide. The lower optical cladding may include a substrate of a transparent material having an appropriate index. Alternatively, the lower cladding layer may include a Ge doped $SiO_2$ core on an undoped fused quartz substrate, silicon dioxide (SiO2), Magnesium Fluoride, diamond-like glass (DLG); polymers (acrylate, polyimide, silicon oxynitride (SiON), and hybrid organic/inorganic sol-gel materials or boron- or fluorine-doped $SiO_2$. The optical core layer may have a thickness between 0.2 micrometers and 10 micrometers inclusive and include materials selected from one of the following: silicon dioxide doped with titanium, zirconium, germanium, tantalum, hafnium, erbium, phosphorus, silver, nitrogen, or a sputtered multicomponent glass.

In one embodiment of the present invention, the index of refraction difference between the core layer and the cladding layer is about 0.3%. The optical core layer has a thickness of about 6.5 micrometers and an index of refraction difference between the core layer and the cladding layer of about 0.5%.

The step of patterning the photoresist layer may include photolithography and the step of depositing the core layer may comprise plasma enhanced chemical vapor deposition or sputtering. Alternatively, the steps of depositing may include one of the following: physical vapor deposition (PVD), sputtering, evaporation, electron beam evaporation, molecular beam epitaxy, pulsed laser deposition, flame hydrolysis deposition (FHD), and more preferably chemical vapor deposition including atmospheric pressure chemical vapor deposition (APCVD), low-pressure chemical vapor deposition (LPCVD), and plasma-enhanced chemical vapor deposition (PECVD).

Additionally, the method may include the step of etching the lower cladding in a way that undercuts the photoresist. The step of etching the lower cladding may including the step of using an isotropic or anisotropic etchant after the step of patterning the photoresist.

Also, the method may include the step of providing a substrate base layer on which to deposit the lower cladding layer. The substrate base layer may comprise silicon, quartz, or a multicomponent glass. The method also may include the step of annealing the optical waveguide.

In one particular embodiment, the cladding includes $SiO_2$ and the core includes $SiO_2$ doped with Ge, P, Ti, or N.

DETAILED DESCRIPTION OF THE INVENTION

FIG. 2a to FIG. 2g illustrates the steps in an exemplary new process in accordance with the present invention for fabricating channel waveguides. A lift-off technique, rather than etching, is used to pattern the waveguide core. This new process may significantly reduce processing time and steps and improve process throughput and quality, thereby reducing chip cost. This new technique also may apply widely both to various high index contrast materials and to low index contrast materials for the fabrication of optical integrated circuit devices.

Figure 2A:
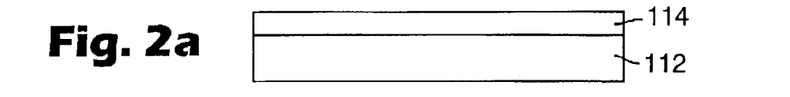
FIG. 2a to FIG. 2g is a schematic step-wise illustration of a method in accordance with the present invention for manufacturing channel optical waveguides.
Figure 2B:
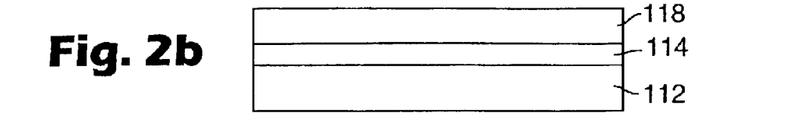
Figure 2C:
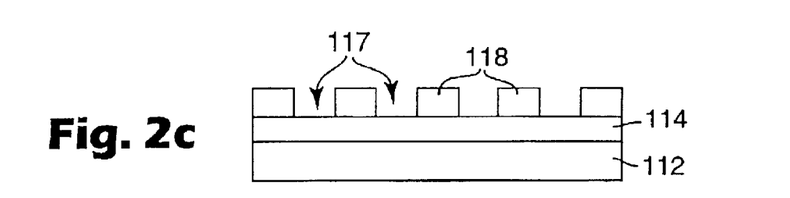
Figure 2D:
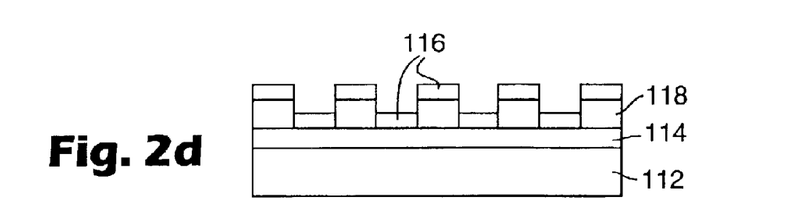
Figure 2E:
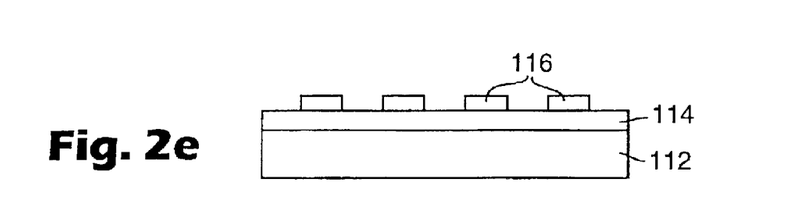
Figure 2F:
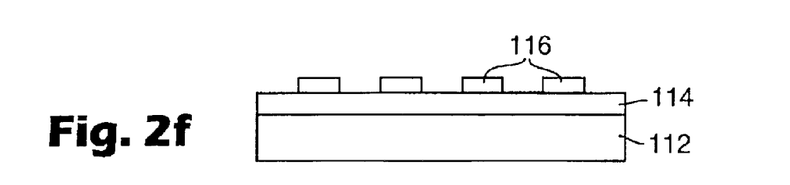
Figure 2G:
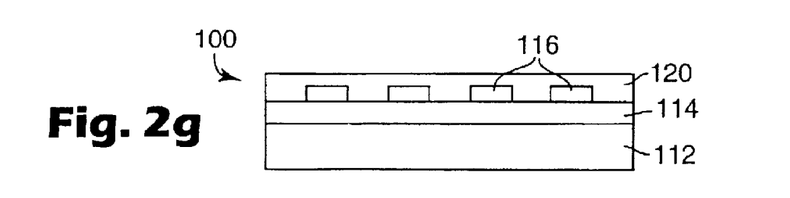
Figure 4:
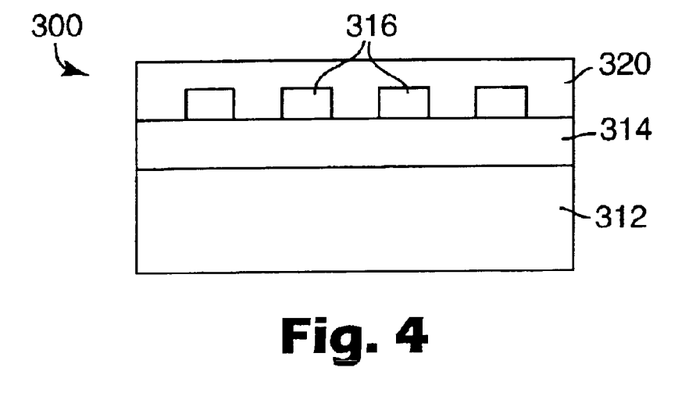
FIG. 4 is schematic view of $SiO_2$/SiON/$SiO_2$/Si waveguide structures in accordance with the present invention.

FIG. 2g and FIG. 4 illustrate exemplary channel waveguides manufactured in accordance with the present invention. Referring to FIG. 2g, such a waveguide 100 includes a substrate 112, a lower cladding layer 114, a core layer 116, an upper cladding layer 120. Appropriate compositions and thicknesses of the core layer, lower cladding layer, upper cladding layer, and any additional layer(s) may be designed through numerical modeling. One well-known waveguide modeling technique is the "transfer-matrix" approach (see, for example, Guided-Wave Optoelectronics, Theodor Tamir (Ed.), 2nd Edition, Springer-Verlag). Alternatively, commercial waveguide modeling tools may be used, including OptiBPM, from OptiWave Corporation, Ottawa, ON, Canada. FIG. 4 illustrates an exemplary optical chip 300 having SiON channel waveguides manufactured in accordance with the process of the present invention. The channel waveguide includes a lower cladding 314 of $SiO_2$, having a thickness of 6.5 μm, and a refractive index n=1.48 on a Si (100) wafer substrate 312. The core 316 includes SiON at a thickness of 1.2 μm and a refractive index n=1.6922. The upper-cladding 320 includes $SiO_2$ with a thickness of 5.4 μm and a refractive index n=1.48.

The exemplary manufacturing process begins as illustrated in FIG. 2a, which is similar to FIG. 1a. A silicon substrate wafer 112, such as Si (100), is provided and lower cladding layer 114 is deposited on an upper surface of the silicon substrate 112. Alternative substrate materials include quartz, or a multicomponent glass. Suitable cladding materials include SiON, $SiO_2$, Magnesium Fluoride, diamond-like glass (DLG); polymers (acrylate, polyimide; silicon oxynitride (SiON); and hybrid organic/inorganic sol-gel materials or _boron- or fluorine-doped $SiO_2$, and other suitable materials known in the art.

The cladding layer 114 may be deposited by methods known in the art, such as flame hydrolysis deposition (FHD), chemical vapor deposition (CVD), plasma-enhanced CVD (PECVD), sol-gel, sputtering, or vacuum evaporation.

In a particular exemplary process, $SiO_2$ is used as a lower-cladding. The lower cladding layer 114 is deposited by PECVD technique using a reactor (such as those commercially available as Plasmalab μP made by Plasma Technology, a member of the Oxford Instruments Group, Bristol BS49 4AP UK) with parameters as follows:

| | |
|---|---|
| Deposition temperature: | 300° C. |
| $SiH_4$ flow: | 3 sccm |
| $N_2O$ flow: | 100 sccm |
| Deposition pressure: | 50 mTorr |
| RF power (13.56 MHz): | 200 W |

The above parameters were designed to achieve a cladding refractive index of 1.48. Deposition time may vary depending on the thickness required for the lower-cladding.

In the next step, illustrated in FIG. 2b, of the present exemplary method, a thick layer of photoresist 118 is applied directly over the cladding layer. This is in contrast with the traditional step illustrated in FIG. 1b of depositing a core layer 16. In an exemplary embodiment, the silicon wafers 112 with the lower-cladding 114 were spin coated with a photoresist, such as positive Shipley 1818 (available from the Shipley Company, Marlborough, Mass. 01752, USA). Other photoresists, both positive and negative, may be used in this process.

The photoresist layer 118 is patterned, as illustrated in FIG. 2c, by conventional methods such as via exposure and development to obtain a patterned photoresist on the lower-cladding. The patterning creates vias 117 that expose portions of the cladding layer 114.

FIG. 2d illustrates the deposition of a core layer 116 over the patterned photoresist layer 118. In an exemplary embodiment, a core layer of SiON is deposited on patterned photoresist by PECVD technique with parameters as follows:

| | |
|---|---|
| Deposition temperature: | 80° C. |
| $SiH_4$ flow: | 8 sccm |
| $N_2O$ flow: | 20 sccm |
| $NH_3$ flow: | 40 sccm |
| Deposition pressure: | 50 mTorr |
| RF power: | 200 W |

Application of the above parameters, is designed to yield a SiON film core layer 116 having a thickness of 1.2 μm and a refractive index of 1.6922. SiON is exemplarily chosen as a core layer since its refractive index may be tuned over a wide range (n=1.46–2.00) resulting in a large degree of freedom in integrated optics design. Alternative materials include high index contrast materials such as $Si_3N_4$, Ti—, Zr—, Hf—, or Ta-doped $SiO_2$, suitable ferroelectric materials, silicon dioxide doped with titanium, zirconium, germanium, tantalum, hafnium, erbium, phosphorus, silver, nitrogen, or a sputtered multicomponent glass such as lanthanum-aluminum-zirconate system ("LAZ").

FIG. 2e illustrates lift-off of the photoresist layer 118. After the deposition of the core layer 116, the photoresist 118 is lifted off, such as in a photoresist stripper. The lift-off technique removes the portions of the core layer 116 over the photoresist layer 118, leaving behind only the portions of the core layer 116 that rested inside of the channel vias 117.

Traditionally, the use of lift-off techniques for manufacturing optical waveguides bad been avoided. Attempts to apply traditional lift-off process to lift-off of waveguide materials by sputtering technique took a long time (several hours or over 10 hours) to achieve a thicker waveguide material layer. The photoresist layer was cross-linked by plasma during long sputtering process and thus removal of the photoresist layer without damaging the underlying layers was very difficult.

In contrast, embodiments of the present invention use a PECVD technique which is capable of fast deposition (generally 10 to 60 min for our waveguide materials) and low process temperatures. These avoid cross-linking the photoresist, thus allowing lift-off removal.

Figure 5:
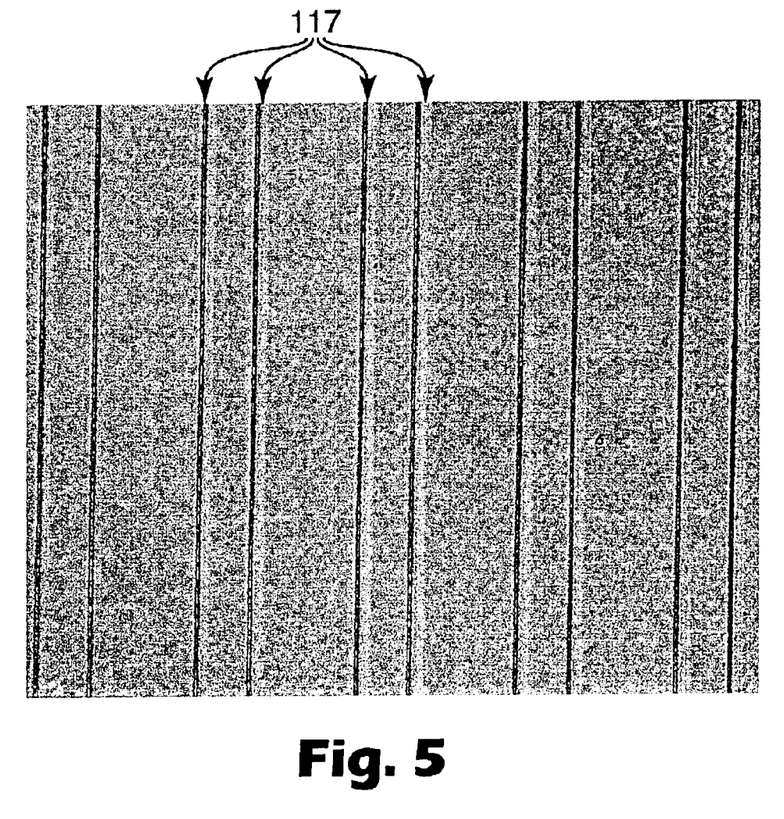
FIG. 5 is an optical microscope photograph of exemplary waveguide ridges formed by a first lift-off process in accordance with the present invention.
Figure 6:
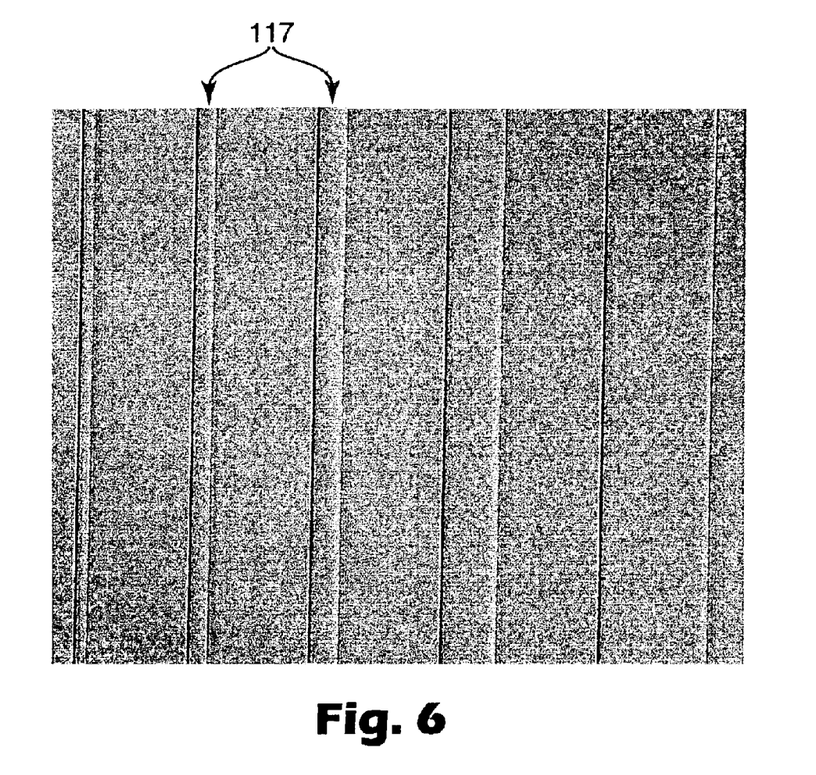
FIG. 6 is an optical microscope photograph of exemplary waveguide ridges formed by a first lift-off process in accordance with the present invention.
Figure 7:
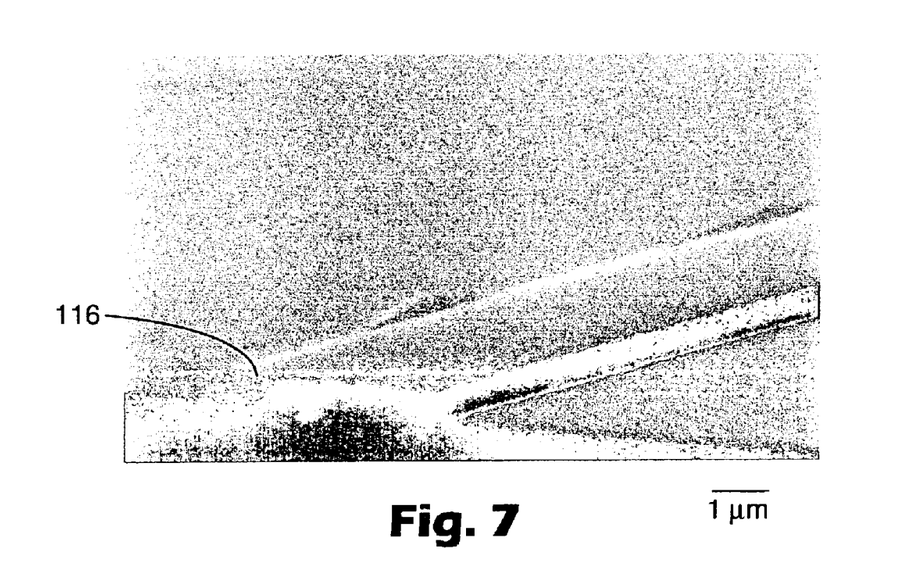
FIG. 7 is a scanning electron microscope (SEM) microphotograph of exemplary waveguide core ridge formed by a first lift-off process in accordance with the present invention.

As illustrated in FIGS. 5 and 6, different waveguide ridges 117 (2, 2.5, 3, 3.5, 4, up to 8.5 $\mu$m in pairs and then 15, 25, 50, 100 $\mu$m) may be formed. FIG. 7 shows a SEM cross section of a 5 $\mu$m core ridge 116 manufactured in accordance with the method of the present invention. It may be appreciated that a very smooth sidewall may be achieved by the lift-off process of the present invention.

Figure 8:
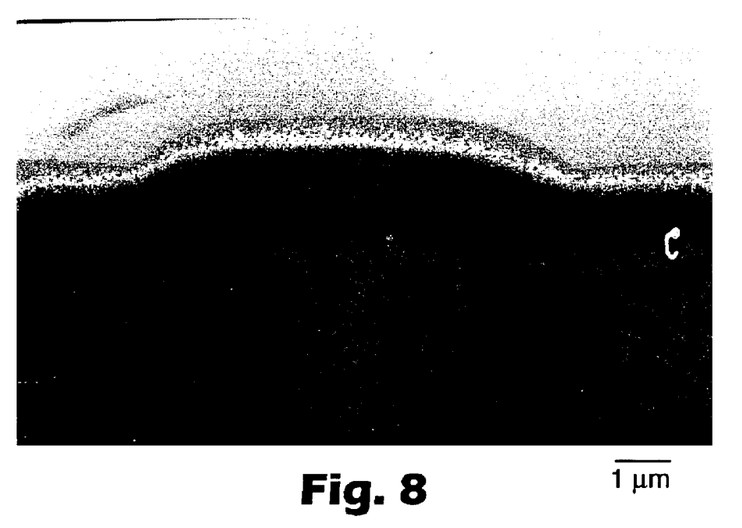
FIG. 8 is an SEM microphotograph of exemplary waveguide core ridge formed by a first lift-off process in accordance with the present invention.

The core layers 116 may then be annealed as illustrated in FIG. 2f. Finally, as illustrated in FIG. 2g, the upper cladding layer 120 including the same or similar materials as the bottom cladding layer 114 is deposited over both the bottom cladding layer 114 and the core layer 116. In a particular embodiment, the upper-cladding 120 includes $SiO_2$ and is deposited to a thickness of 5.4 $\mu$m by PECVD at the same or similar parameters as the lower-cladding layer 114. FIG. 8 is a photograph of a SEM cross section of the growth profile of the upper-cladding of a 5 mm waveguide channel manufactured in accordance with the present invention.

Figure 9:
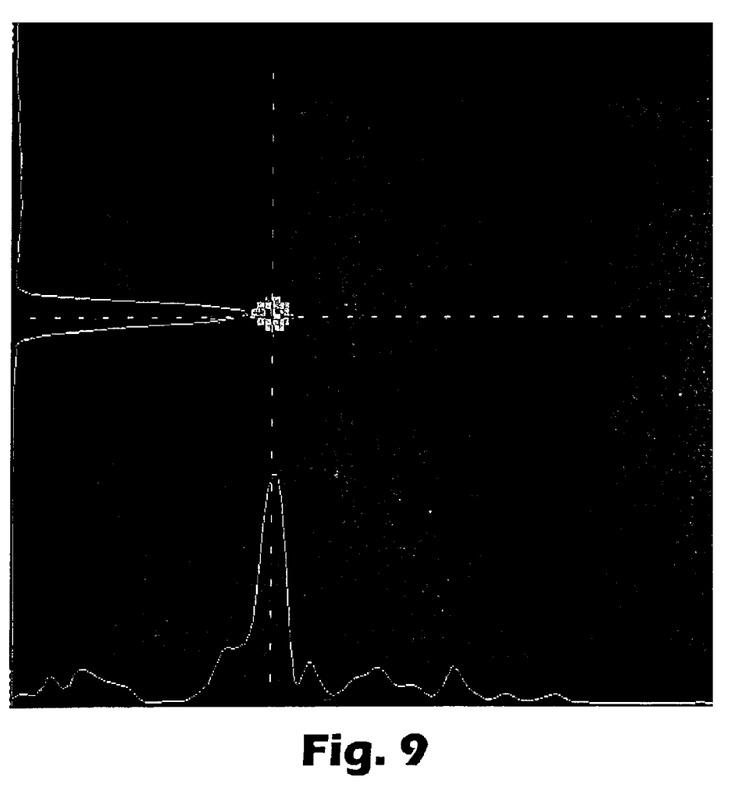
FIG. 9 is the single mode output intensity measured of a 6.5 μm waveguide channel manufactured in accordance with the present invention.

FIG. 9 shows the single mode output intensity for an exemplary 6.5 $\mu$m waveguide channel manufactured in accordance with the present invention. Core ridge widths of channels below 8.5 $\mu$m are single mode at 1550 nm with the SiON waveguide structure as shown in FIG. 4, while ridge widths above 8.5 $\mu$m are multi-modal guides. The propagation loss was measured to be around 2.85 dB/cm, which is a normal value for as-deposited SiON films.

Figure 3A:
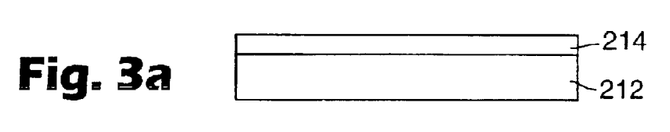
FIG. 3a to FIG. 3h is a schematic step-wise illustration of a second embodiment
Figure 3B:
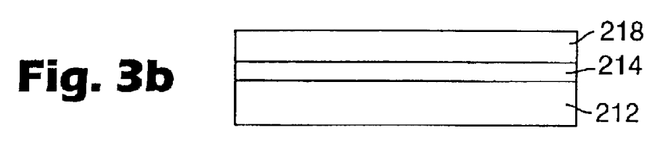
Figure 3C:
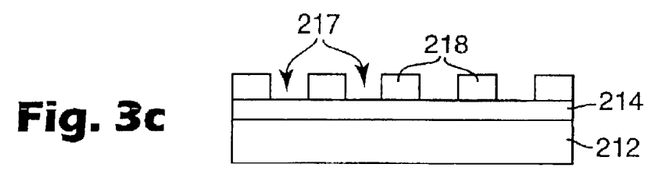

Removal of the photoresist pattern may cause tearing at the edges of the deposited patterned layer. To overcome this problem, the photoresist layer may have a "reverse bevel" in it. FIG. 3 illustrates steps in an exemplary process in accordance with the present invention where the photoresist layer is undercut when patterned. The steps illustrated in FIGS. 3a to 3c are similar to those illustrated in FIGS. 2a to 2c. A lower cladding layer 214 is deposited over a silicon wafer 212. A photoresist layer 218 is then deposited over the cladding layer 214 and patterned to create channels 217.

Figure 3D:
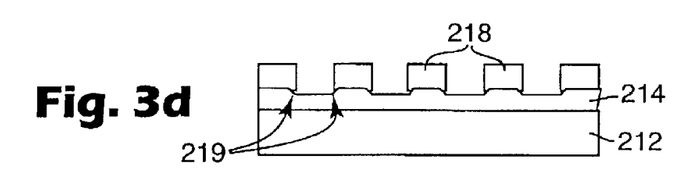

As illustrated in FIG. 3d, the present embodiment differs in that undercut channels 219 are etched into the cladding layer 214. In general, it is difficult to achieve an undercut photoresist pattern since the edges of the photoresist pattern are rounded at the base and top of the pattern and generally the edges tend to be overcut rather than undercut (that is, the bevel at the photoresist edge is often in the wrong direction).

Figure 10:
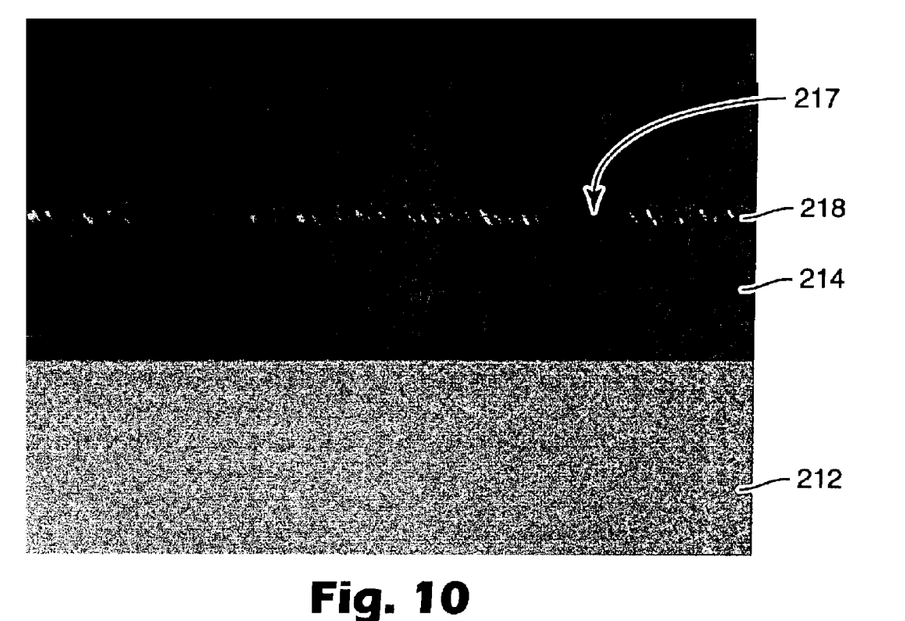
FIG. 10 is an optical microscope photograph of exemplary waveguide core ridge formed by a first lift-off process in accordance with the present invention.

FIG. 10 is a photograph that corresponds to the schematic cross-section illustrated in FIG. 3d. Following are exemplary parameters used in this step of the process according to the present invention. An 8 $\mu$m thick $SiO_2$ cladding layer 214 was deposited on a Si wafer 212 by PECVD. A photoresist layer 218, including a photoresist such as Shipley 1818, was coated at 4000 rpm to a thickness of about 1.9 $\mu$m over the $SiO_2$ cladding layer 214. The photoresist layer 218 cured at 105 degrees C. for 30 min and then was exposed to light having an energy density of about 182 mJ/cm$^2$ with a metal mask. Following a thirty-second development in MF319 developer and a thorough rise in de-ionized water, a patterning of photoresist layer 218 was accomplished.

An isotropic etch was then performed on the exposed portions of the lower cladding layer 214 under the following parameters:

| | |
|---|---|
| Buffered HF: | 1:6 (HF:NH$_4$F) |
| Etch time: | 5 min |
| Etch rate: | 100 nm/min |

An anisotropic etchant also may be used. Using the above parameters, a 0.5 $\mu$m etch depth on the $SiO_2$ was obtained (see channel 217), with etch features 219.

Figure 3E:
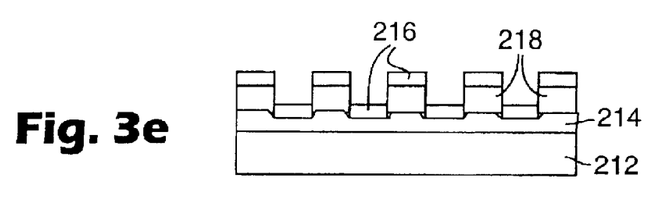
Figure 11:
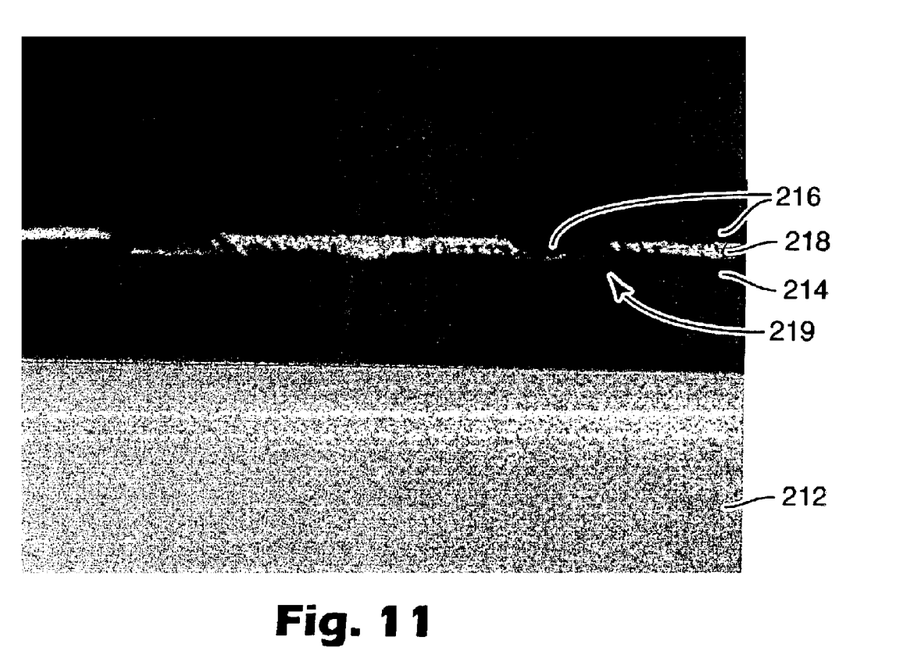
FIG. 11 is an optical microscope photograph of exemplary waveguide ridges formed by a second lift-off process in accordance with the present invention.

Referring now to FIG. 3e, the core layer 216 is then deposited over the photoresist layer 218 and the exposed portions of the lower cladding layer 214. FIG. 11 is a photograph of an actual exemplary 2.5 $\mu$m SiON core layer 216 deposited on the etched areas 217 and the photoresist 218 by PECVD.

Figure 3F:
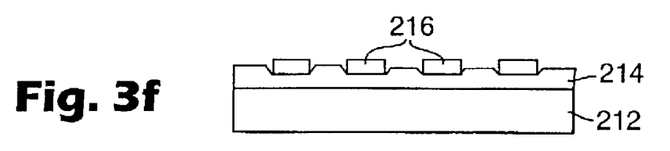
Figure 3G:
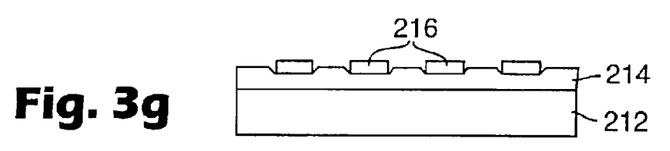
Figure 12:
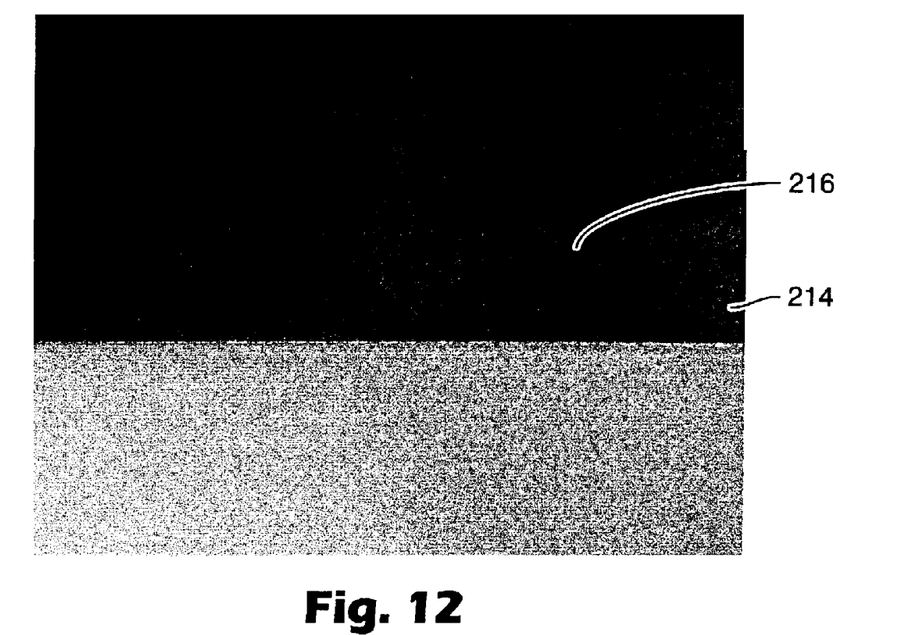
FIG. 12 is an optical microscope photograph of exemplary waveguide core ridge formed by a second lift-off process in accordance with the present invention.

As illustrated in FIG. 3f, the photoresist layer 218 is removed along with the portions of the core layer 216 overlapping the ridges of the photoresist layer. FIG. 12 shows SiON waveguide core ridges 216 after the removal of the photoresist. It has been successfully demonstrated that more than 3 $\mu$m thick core layers may be fabricated by lift-off process with undercut. Thus, it is possible to apply this technique to low index contrast materials.

Figure 3H:
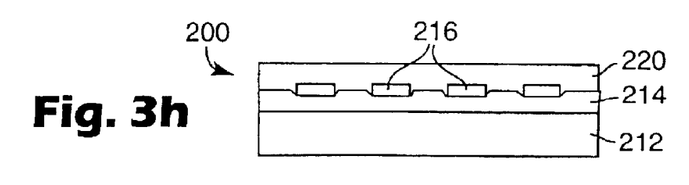
Figure 13:
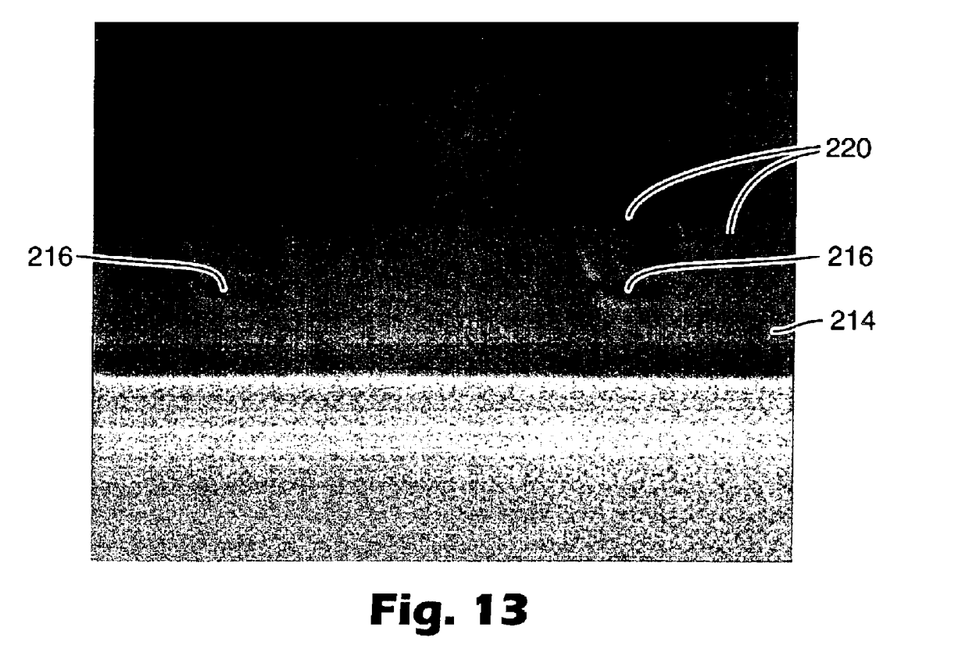
FIG. 13 is an optical microscope photograph of exemplary waveguide core ridge formed by a second lift-off process in accordance with the present invention.

Finally, as illustrated in FIG. 3h, an upper cladding layer 220 is deposited over both the core ridges 216 and the lower cladding layer 214. FIG. 13 shows an actual exemplary 8 $\mu$m upper cladding deposited on the core layer by PECVD process. The refractive index of both the lower and the upper claddings, 214 and 220, is 1.46 while the refractive index of the core ridges 216 is 1.55. A very good $SiO_2$ step coverage achieved by the present PECVD process may be appreciated.

The process of the present invention may be used in the manufacture of a variety of optical waveguides. In yet another exemplary embodiment illustrated in FIGS. 14 to 16, a silicon substrate 312 was used. A 3 $\mu$m thermal oxidized $SiO_2$ cladding layer 314 was deposited over the substrate 312. A photoresist layer 318, including a suitable photoresist such as AZ4400 (Clariant Corporation, Business Unit Electronic Materials, 70 Meister Avenue, Somerville, N.J. 08876) was coated on the $SiO_2$ cladding layer 314 at 4000 rpm to a thickness of about 4.5 $\mu$m. The photoresist layer 318 was cured at 110° C. for 200 seconds and then was exposed to light having an energy density of about 280 mJ/cm$^2$ with a metal mask. Following a 60 second development in a developer, such as AZ 400K (Clariant Corporation, Business Unit Electronic Materials, 70 Meister Avenue, Somerville, N.J. 08876), and a thorough rise in de-ionized water, the shown patterning of the photoresist layer was accomplished.

Figure 14:
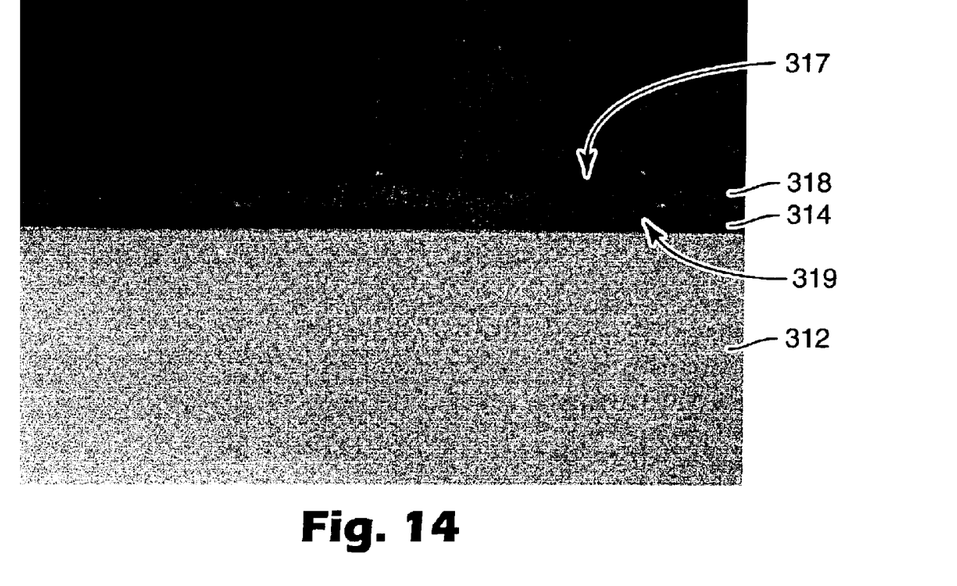
FIG. 14 is an optical microscope photograph of exemplary waveguide ridges formed by a third lift-off process in accordance with the present invention.

The cladding layer was then isotropically etched under the following parameters:

| | |
|---|---|
| Buffered HF: | 1:6 (HF:NH$_4$F) |
| Etch time: | 20 min |
| Etch rate: | 75 nm/min |

Figure 15:
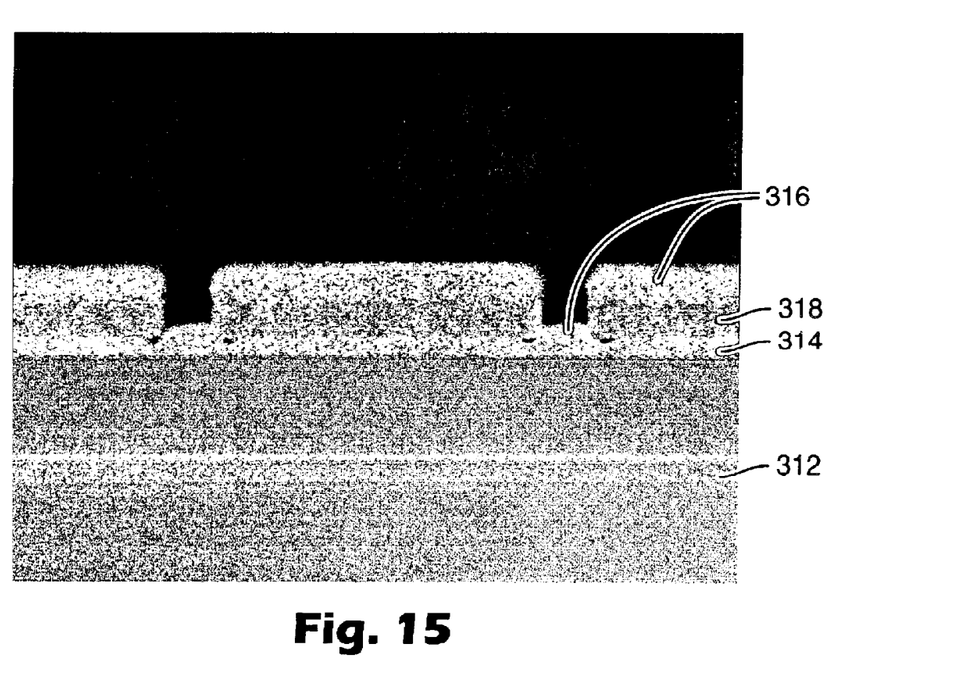
FIG. 15 is an optical microscope photograph of exemplary waveguide core ridge formed by a third lift-off process in accordance with the present invention.

Using the above parameters, a 1.5 µm etch depth of SiO$_2$ was obtained. Referring to FIG. 15, a 5 µm layer of diamond-like glass (DLG) 316 was deposited with the Si using a commercially parallel-plate capacitively coupled plasma reactor (commercially available from PlasmaTherm, Inc. of St. Petersburg, Fla.) on the etched area and the photoresist as shown in FIG. 2a to FIG. 2g. The wafer was placed on the powered electrode during the deposition and DLG was deposited under the following conditions:

| | |
|---|---|
| Tetramethlysilane flow: | 50 sccm |
| O$_2$ flow: | 200 sccm |
| Deposition pressure: | 97 mTorr |
| RF power (13.56 MHz) | 600 Watts |
| Deposition time: | 100 minutes |

It may be appreciated that the DLG material did not deposit significantly on the sidewall of the photoresist, since a directional deposition process was used.

Figure 16:
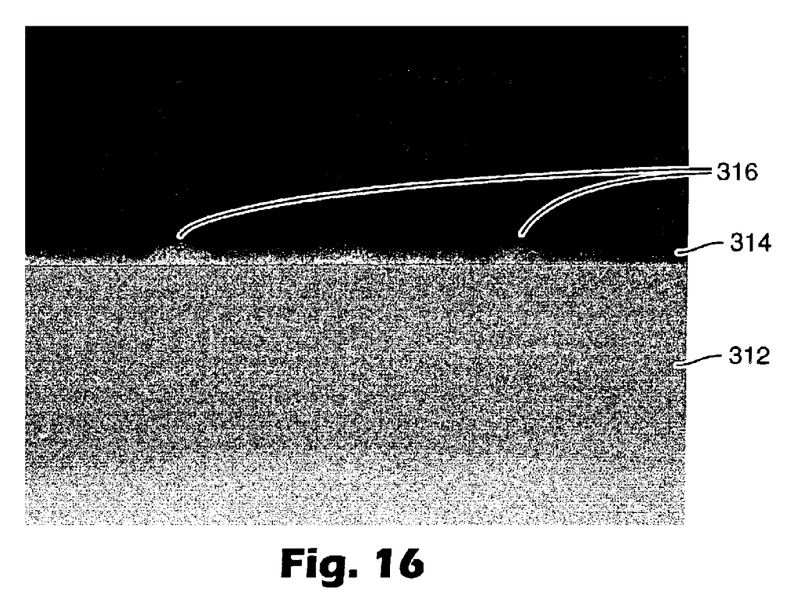
FIG. 16 is an optical microscope photograph of exemplary waveguide core ridge formed by a third lift-off process in accordance with the present invention.

FIG. 16 presents DLG waveguide core ridges 316 after the removal of the photoresist. A more than 5 µm thick core layer may be fabricated using the present lift-off process with undercut. The ability to create deeper core ridges allows the use of the present technique with low index contrast materials.

The process of the present invention offers reduced steps and lower manufacturing times than traditional methods. Use of the present invention may significantly improve throughput and quality of optical waveguides, thereby reducing device costs and potentially enabling penetration of waveguide devices into cost-sensitive applications.

Waveguides manufactured in accordance with the present invention may be used in a variety of optical circuits such as a Mach-Zehnder interferometer, a thermo-optical switch, an arrayed waveguide grating, a directional coupler, or a waveguide Bragg grating filter. Other uses include active waveguide devices including waveguides fabricated from electrooptic materials. Examplary electrooptic materials include electrically poled glasses.

Those skilled in the art will appreciate that the present invention may be used in the fabrication of a variety of different optical structures. While the present invention has been described with reference to exemplary preferred embodiments, the invention may be embodied in other specific forms without departing from the spirit of the invention. Accordingly, it should be understood that the embodiments described and illustrated herein are only exemplary and should not be considered as limiting the scope of the present invention. Other variations and modifications may be made in accordance with the spirit and scope of the present invention.

What is claimed is:

1. A method for manufacturing an optical waveguide device, comprising in order the steps of:
   a. depositing a lower cladding layer;
   b. coating a photoresist layer directly on the lower cladding layer;
   c. patterning the photoresist layer to create channels;
   d. etching the lower cladding layer to form undercut channels that undercut the photoresist layer;
   e. depositing a core layer, wherein a first portion of the core layer is deposited inside the channels and a second portion overlays the patterned photoresist layer;
   f. removing the patterned photoresist layer and the second portions of the core layer overlaying the patterned photoresist layer; and
   g. depositing an upper cladding layer.

2. The method of claim 1, wherein the optical waveguide is a single-mode waveguide.

3. The method of claim 1, the lower optical cladding comprising a substrate of a transparent material having an appropriate index.

4. The method of claim 3, the lower cladding layer including a Ge doped SiO$_2$ core on an undoped fused quartz substrate.

5. The method of claim 1 where the index of refraction difference between the core layer and the cladding layer is about 0.3%.

6. The method of claim 1 where the optical core layer has a thickness between 0.2 micrometers and 10 micrometers inclusive.

7. The method of claim 1, wherein the optical core layer has a thickness of about 6.5 micrometers and an index of refraction difference between the core layer and the cladding layer of about 0.5%.

8. The method of claim 1, wherein the step of patterning the photoresist layer includes photolithography.

9. The method of claim 1, wherein the step of depositing the core layer comprises plasma enhanced chemical vapor deposition.

10. The method of claim 1, wherein the step of depositing the core layer comprises sputtering.

11. The method of claim 1, the step of etching the lower cladding including the step of using an anisotropic etchant after the step of patterning the photoresist.

12. The method of claim 1, wherein the steps of depositing includes one of the following: physical vapor deposition (PVD), sputtering, evaporation, electron beam evaporation, molecular beam epitaxy, pulsed laser deposition, flame hydrolysis deposition (FHD), and chemical vapor deposition including atmospheric pressure chemical vapor deposition (APCVD), low-pressure chemical vapor deposition (LPCVD), and plasma-enhanced chemical vapor deposition (PECVD).

13. The method of claim 1, further comprising the step of providing a substrate base layer on which to deposit the lower cladding layer.

14. The method of claim 13, wherein the substrate base layer comprises silicon, quartz, or a multicomponent glass.

15. The method of claim 1, further comprising the step of annealing the core and lower cladding layer after the step of removing the photoresist.

16. The method of claim 1, further comprising the step of annealing the optical waveguide.

17. The method of claim 1, wherein the lower cladding layer comprises a material selected from one of the following: silicon dioxide (SiO2), Magnesium Fluoride, diamond-like glass (DLG); polymers (acrylate, polyimide; silicon oxynitride (SiON); and hybrid organic/inorganic sol-gel materials or boron- or fluorine-doped SiO$_2$.

18. The method of claim 1, wherein the core layer comprises a materials selected from one of the following: silicon dioxide doped with titanium, zirconium, germanium, tantalum, hafnium, erbium, phosphorus, silver, nitrogen, or a sputtered multicomponent glass.

19. The method of claim 1, wherein the cladding includes $SiO_2$ and the core includes $SiO_2$ doped with Ge, P, Ti, or N.

20. The method of claim 1, wherein the photoresist is a positive photoresist.

21. The method of claim 1, wherein the photoresist is a negative photoresist.

22. The method of claim 1, wherein the step of patterning the photoresist includes applying a photolithography process to the photoresist layer.

23. The method of claim 1, wherein the step of patterning the photoresist includes using e-beam lithography.

24. The method of claim 1, wherein the step of patterning the photoresist layer includes patterning a plurality of vias to receive an array of optical waveguides.

* * * * *

UNITED STATES PATENT AND TRADEMARK OFFICE
CERTIFICATE OF CORRECTION

PATENT NO. : 6,946,238 B2 Page 1 of 1
DATED : September 20, 2005
INVENTOR(S) : Zhang, Jun-Ying It is certified that error appears in the above-identified patent and that said Letters Patent is hereby corrected as shown below:

Column 1,
Line 51, after "1$h$" insert -- , --.

Column 2,
Line 14, delete "(SiO2)" and insert -- (SiO$_2$) --.

Column 5,
Line 12, delete "bad" and insert -- had --.

Column 8,
Line 64, delete "(SiO2)" and insert -- (SiO$_2$) --.
Line 65, after "polyimide" insert -- ) --.

Signed and Sealed this

Twenty-first Day of March, 2006

JON W. DUDAS
*Director of the United States Patent and Trademark Office*